United States Patent [19]

Sandford

[11] Patent Number: 4,636,532
[45] Date of Patent: Jan. 13, 1987

[54] METHOD FOR PREPARING POLYGLUTARIMIDE HAVING A LOWER MOLECULAR WEIGHT AND A LOW POLYDISPERSITY

[75] Inventor: Harold F. Sandford, Natick, Mass.

[73] Assignee: Shipley Company Inc., Newton, Mass.

[21] Appl. No.: 786,531

[22] Filed: Oct. 11, 1985

[51] Int. Cl.$^4$ ............................................... C08F 8/00
[52] U.S. Cl. ........................................... 522/3; 522/79; 522/153; 522/163; 522/913; 525/77; 525/78; 525/85; 525/330.5; 430/270
[58] Field of Search .................... 522/153, 163, 913, 3, 522/79; 525/77, 78, 85, 330.5; 430/270

[56] References Cited

U.S. PATENT DOCUMENTS

| | | | |
|---|---|---|---|
| 3,033,782 | 5/1962 | Rauch | 525/330.5 |
| 3,964,908 | 6/1976 | Bargon et al. | 522/3 X |
| 4,217,424 | 8/1980 | Weese et al. | 525/85 X |
| 4,246,374 | 1/1981 | Kopchik | 525/330.5 X |
| 4,569,897 | 2/1986 | Kalyanaraman | 430/270 X |

Primary Examiner—John E. Kittle
Assistant Examiner—Cynthia Hamilton
Attorney, Agent, or Firm—Robert L. Goldberg

[57] ABSTRACT

A method for reducing the molecular weight of a polyglutarimide polymer having a molecular weight of 50,000 or higher, is disclosed. This is accomplished by the following steps:

(a) dissolving the polyglutarimide polymer in a solvent which is transparent to ultraviolet radiation;
(b) exposing the polyglutarimide solution to ultraviolet radiation for a sufficient time to reduce the molecular weight of the polyglutarimide; and
(c) re-isolating the resin by precipitating the resin in an organic solution. A process for preparing a coatable photoresist composition wherein the molecular weight of a polyglutarimide resin may be reduced to a desired weight for a specific use is also taught.

7 Claims, 1 Drawing Figure

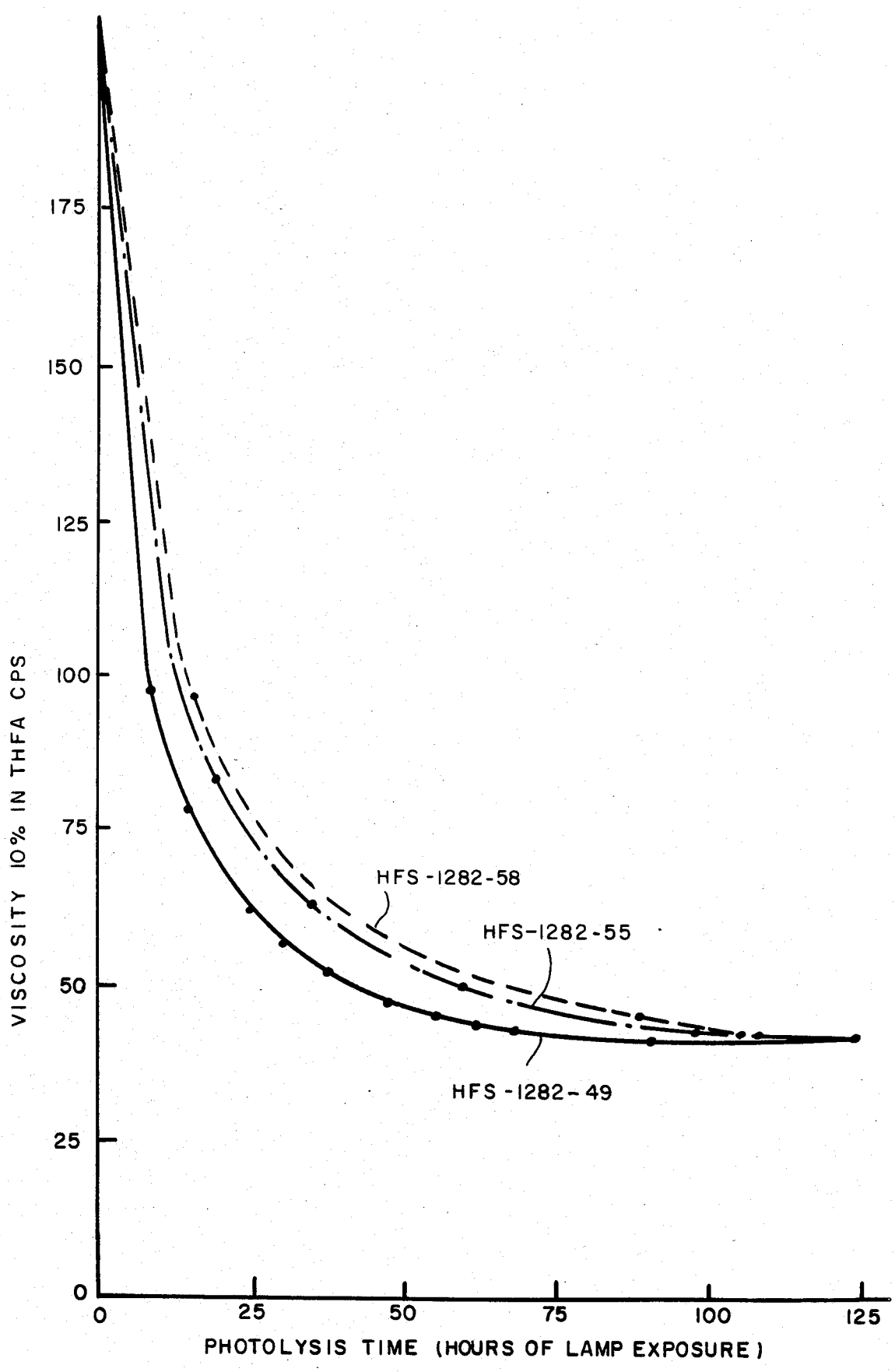

METHOD FOR PREPARING POLYGLUTARIMIDE HAVING A LOWER MOLECULAR WEIGHT AND A LOW POLYDISPERSITY

BACKGROUND

This invention relates to a method for reducing a high molecular weight polydimethylglutarimide polymer to a lower molecular weight polymer, to obtaining polymers having a low polydispersity, and the use of these polymers in a positive photoresist system.

Photoresist compositions are often used as masks to protect substrates from chemical etchants in photoengraving processes. This property has resulted in their use in the manufacture of printed circuit boards and semiconductors. For use in the manufacture of a semiconductor, the photoresist must possess chemical resistance, must adhere to the circuit substrate, and for high density circuits, must be capable of fine line resolution.

Positive photoresists comprise a light sensitive compound in a film-forming polymeric resin binder. The resins improve the adhesion of the coating composition in these photoresists. They further fortify the coat for better chemical resistance, reduce the tendency for sensitizers to crystallize out, increase the viscosity encoding for coating characteristics and reduce the costs of the resist solution as a partial substitute for sensitizers.

Polyimide resins, in particular, have a number of properties which make them extremely useful when incorporated in positive photoresists because they are very sensitive to both electronic beam and light irradiation. Further, they improve the thermal stability of such photoresists.

U.S. Pat. No. 3,964,908, incorporated herein by reference, describes a process for forming an image using a polydimethylglutarimide polymer having high thermal stability. This polymer is formed directly on the photoresist itself. Consequently, the photoresist system formed cannot contain a sensitizer because known photosensitizers thermally decompose at temperatures below that used in the in-situ polymerization reaction used to form this resist.

U.S. Pat. No. 4,524,121 to Rohm and Haas, which is incorporated herein by reference, describes a photoresist system that contains a "preformed" polyglutarimide polymer. By using a "preformed" polymer, the photoresist formed can include a sensitizer. Accordingly, the resulting photoresist has higher thermal stability and good image resolution without the need for subsequent film hardening while possessing excellent transparency over a wider range of exposure frequencies than typical phenolic (Novolak) coupler resins. A process for forming polyglutarimide polymers is disclosed in U.S. Pat. No. 4,246,374. The molecular weight of the polyglutarimide resin used by U.S. Pat. No. 4,5224,121, is stated to be preferably at least about 50,000 weight average molecular weight in contrast to the 10,000 average molecular weight of phenolic resins. This high a molecular weight for the resin can cause processing problems when the polymer is incorporated into certain resist products. The viscosity of resultant solutions is excessive when solutions of sufficiently high solid contents are formulated to provide films of the proper thickness. The thin films obtained are often very badly striated.

It is difficult under normal commercial manufacturing processes to prepare polyglutarimide polymers with a wide range of molecular weights. Typically, the resin produced has a molecular weight in excess of 100,000 weight average molecular weight, more typically, the weight is about 140,000 weight average molecular weight. A simple process that would enable users to lower the molecular weight of these high molecular weight polydimethylglutarimide polymers and thereby decrease the solution viscosity of the polymer to meet the particular demands of specific applications would be useful. Such a process would be particularly useful in preparing various coatable resist compositions, such as photoresists, X-ray resists and electron beam resists. It is also important that the process used in lowering the molecular weight of the high molecular weight polymers result in relatively uniform molecular weight polymers.

A process for reducing the molecular weight of high molecular weight polydimethylglutarimide has now been discovered. This process also results in polymers having the low polydispersity, i.e., a narrow range of molecular weights. Additionally, this process can be used in preparing a high quality, aqueous base developable positive resist film on a substrate for lithographic applications.

BRIEF DESCRIPTION OF THE DRAWING

FIG. 1 is a graph showing the change in viscosity of a polymer of the present invention versus exposure time.

THE INVENTION

It has been known that polyglutarimide type polymers, when exposed to ultraviolet radiation, show a photodegradation pattern which results in a main-chain scission with formation of olefin and ketene end groups. Hiraoka, H, *IBM J. Res. Dev.*, 9 (2): 359 (1976); Hiraoka, H. *IBM J. Res. Dev.*, 10(3): 719 (1977).

It has now been found that by dissolving polydimethylpolyglutarimide resin in a solvent in which the resin is soluble and transparent to ultraviolet light in a range of approximately 220 nm to 300 nm results in a process where the molecular weight of a polyglutarimide resin can be reduced without adversely affecting its properties as a resin. Such solvents are well known and can be selected by the person of ordinary skill in the art. Obtaining a predetermined desired weight polymer is readily accomplished by the skilled practicioner. The resin solution is illuminated with ultraviolet light until solution viscosity or molecular weight, as determined by gel permutation chromatography, is reduced to the specific range desired. The resin is then re-isolated by adding the photolyzed resin solution to a solvent in which it is not soluble. It is possible thereby to isolate resins of a narrow molecular weight range because very low molecular weight fragments, which typically constitute less than 10% of the original starting resins, do not precipitate from the solvent mixture.

The length of exposure to the ultraviolet radiation will reduce the molecular weight of the resin to the desired range. The intensity of the ultra violet light source and the volume of polyglutarimide resin used will affect the time needed to obtain the desired molecular weight. Typically, this process reduces polydimethylglutarimide resins with molecular weight of about 140,000 to resins with a molecular weight of about 20,000.

The ultraviolet light source used can be any source capable of generating the desired radiation. For example, a mercury vapor lamp or an ultraviolet excimer laser (such as KrF operating at 249 nm) can be used.

By varying the molecular weight of the polyglutarimide resin it is possible to adjust the physical properties of resultant photoresist films. Thus, the use of the present process enables one to obtain polyglutarimide resins of the desired molecular weight for a specific lithographic application.

The use of the present process is particularly suited for preparing multilayer photoresists such as those described in U.S. Pat. Nos. 4,211,834 and 4,370,405, which are incorporated herein by reference. These multilayer photoresists typically comprise a top layer of a photosensitive resist material, and a second photosensitive layer deposited on a substrate. In preparing, for example, a bi-layer photoresist the use of a polydimethylglutarimide in the bottom layer is frequently preferable. In such a resist, being able to precisely control the thickness of each layer is quite important. The use of the present process to select a predetermined molecular weight for the polyglutarimide polymer enables one to achieve this goal.

Polyglutarimides are also useful in conventional photoresists. Preparation of a coatable photoresist composition is well known to the skilled artisan. The polyglutarimide is dissolved in a non-aqueous, non-reactive solvent. Photosensitizers are then added to the solvent.

The photosensitizers that can be used are well known in the photoresist art. These photosensitizers include diazo oxides such as the 2,3,4-trihydroxy benzophenone ester of 1-oxo-2-diazo naphthalene-5-sulfonic acid (SOX).

Other useful sensitizers can be formed from quinone diazides such as benzoquinone diazides such as benzoquinone 1,2-diazide-4-sulfonylchloride; and naphthoquinone diazides such as naphthoquinone-1,2-diazide-5-sulfonylchloride, naphthoquinone-1,2-diazide-4-sulfonylchloride, naphthoquinone-2,1-diazide-4-sulfonylchloride and naphthoquinone-2,1-diazide-5-sulfonylchloride. Other diazo compounds other than the diazo oxides or quinone diazide compounds may also be suitable reagents for forming positive sensitizers which can be used in this invention.

It is also possible to add certain additives to increase the sensitivity of quinone diazide sensitizers as described in U.S. Pat. No. 3,661,582 as well as the dibasic carboxylic acids, monobasic unsaturated aromatic acids, hydroxyphthalic acids alone or in combination in amounts of from 0.01% to about 15% on a weight basis based on the weight of the polyglutarimide coupler resin as disclosed in U.S. Pat. No. 4,009,033.

Mixtures of the polyglutarimides and these positive sensitizers in weight ratios of from about 99:1 to about 1:1 can be spun cast from a suitable solvent to give high quality clear films with no hazing or other indicia of component separation due to incompatibility. Typically, the level of the sensitizer compound ranges from about 5 to about 30 weight percent based on the weight of the polyglutarimide coupler resin.

Suitable non-aqueous, non-reactive solvents useful for dissolving polyglutarimides and sensitizers include:
amide, polar, aprotic solvents such as dimethylformamide (DMF), dimethylacetamide (DMAC), N-methylpyrrolidinone (NMP), and dimethylpropyleneurea (DMPU);
hydroxylic, polar, protic solvents such as cellosolve acetate (CA), tetrahydrofurfuryl alcohol (THFA), acetol, methyl carbitol (MeCarb) and 2-methoxy ethanol (methylcellosolve);
polar, aprotic, ketonic solvents such as cyclopentanone (CP);
small chain, polar, carboxylic acids such as acetic acid and formic acid;
polar, basic, ethers such as n-alkyl morpholines such as n-methyl morpholine and n-ethyl morpholine, and tetrahydrofuran; and mixtures of the above; and
cyclic ethers such as 1,3-dioxolane or 1,4-dioxane.

Other compounds, which are not, by themselves solvents for polyglutarimides, can be combined with one or more of the above-described solvents to form a solvent system which can dissolve the polyglutarimide and sensitizers and aid in spin casting the photoresist film. Some examples of these compounds include acetyl acetone, 1-methoxy-2-propanol, cyclohexanone, chlorobenzene (CB), conventional solvent, xylene, toluene, butyl acetate, 1,2-dimethoxyethane, ethylene glycol monomethyl ether, 2-4-pentanedione, and the like.

Preferred solvent systems include mixtures of DMF/CS/chlorobenzene (CB), THFA/CS, cyclopentanone, THFA/methylacetoacetate, and chlorobenzene/2-methyoxy ethanol.

The polyglutarimide coupler resin is typically dissolved in the solvent system to a concentration of from about 5 to about 30 weight percent.

The positive photoresist system is capable of being spun cast from the solution to deposit an adherent film on an oxide coated, nitride coated or uncoated silicon wafer or aluminum coated substrate. The thickness of the photoresist film can be controlled by adjusting the level of coupler resin and/or sensitizer solids in the mixture, the level and type of solvent and by varying the spin speed.

Any conventional spin casting method such as those described in *Integrated Circuit Fabrication Technology*, D. J. Elliott, McGraw-Hill Book Company, 1982, chapter 6, pages 124–144, can be utilized with the phototresist system of the invention.

Typcially, the wafer is placed on a rotating disc such as a Headway R wafer spinner and rotated at speeds of from about 3000 to 7000 revolutions per minute. The photoresist system is deposited onto the wafer over a few second period by either a continuous or dropwise addition while the wafer is stationary, or while it is spinning.

It is also possible to pretreat the wafer with a primer immediately before spin casting the photoresist film onto the surface. Primers such as hexamethyldisiliazane (HMDS) and beta-3,4-epoxy cyclohexylethyl trimethoxysilane ("CHOES") can be used compatibly with the polyglutarimide photoresist systems of the invention. This primer may optionally be included as an additive, at levels on the order of from about 1 to 15 weight percent based on the amount of coupler resin, in the photoresist system to improve adhesion and reduce cracking of the film (crazing) during development.

The following examples are given solely for the purpose of illustration and are not to be considered a limitation on the method of the present invention.

EXAMPLE 1

Polydimethylglutarimide resin beads are dissolved in tetrahydrofurfuryl alcohol (THFA) as a 10% by weight solution (60 grams of resin in 540 grams of THFA). This solution was then placed in a photochemical reaction assembly (Ace Glass, Inc. No. 7861-250, consisting of a water cooled quartz immersion well, a Canrad-Hanovia medium pressure, 100-watt, mercury vapor lamp, a transformer, a thermometer and a magnetic stirrer). The resin solution was illuminated with the mercury vapor lamp for approximately 10 hours with stirring. This reduced the solution viscosity from approximately 200 centipoise (a resin with a molecular weight of approximately 105,000 by gel permeation chromotography, GPC) to a solution viscosity of approximately 40 centipoise (a resin with a molecular weight below 20,000 in a dispersity of approximately 2, as determined by GPC).

This resin was re-isolated by precipitation into 3 liters of methanol, isolated by vacuum filtration, reslurried twice more in 500 ml methanol, and dried at 50° C. in a forced-air convection oven. The resulting resin had a narrow molecular weight range, i.e., low polydispersity.

EXAMPLE 2

Three 13 liter samples of 1400 grams of polydimethylglutarimide resin dissolved in 12.6 kilograms of tetrahydrofurfurylalcohol (HFS-1282-49, HFS-1282-55 and HFS-1282-58) prepared as described above were each exposed to a 450-watt, mercury vapor lamp using the procedure as described in Example 1. The change in viscosity over the time for each sample is shown in FIG. 1.

The typical product yield was 1150 to 1250 grams of a low molecular weight polymer with weights ranging from 19,500 to 21,000.

It will be appreciated that those skilled in the art may make modifications and improvements on the invention disclosed herein without departing from the spirit and the scope of the invention as described in the claims.

I claim:

1. A method for reducing the molecular weight of a polyglutarimide polymer having a molecular weight of 50,000 or higher, wherein the method comprises:
    (a) dissolving the polyglutarimide in a solvent which is transparent to ultraviolet radiation;
    (b) exposing the polyglutarimide solution to ultraviolet radiation for a sufficient time to reduce the molecular weight of the polyglutarimide; and
    (c) re-isolating the resin by precipitating the resin in an organic solution.

2. The method of claim 1 wherein the polyglutarimide polymer is a polydimethylglutarimide polymer.

3. The method of claim 1, wherein the solvent is transparent to ultraviolet light from approximately 220 nm to 300 nm.

4. The method of claim 3, wherein the ultraviolet light source is a short wavelength ultraviolet light of 300 nm and shorter.

5. The method of claim 1, wherein the solvent is tetrahydrofurfuryl alcohol.

6. The method of caim 1, wherein the resin is re-isolated by precipitation in methanol.

7. The method of claim 1, wherein the resin solution is illuminated by the ultraviolet light for approximately 10 hours while stirring.

* * * * *